United States Patent
Kawakami et al.

(10) Patent No.: US 8,411,395 B2
(45) Date of Patent: Apr. 2, 2013

(54) SPIN VALVE ELEMENT AND METHOD OF DRIVING SAME

(75) Inventors: Haruo Kawakami, Miura (JP); Yasushi Ogimoto, Higashiyamato (JP); Eiki Adachi, Sagamihara (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 155 days.

(21) Appl. No.: 12/739,740

(22) PCT Filed: Aug. 28, 2008

(86) PCT No.: PCT/JP2008/065423
§ 371 (c)(1),
(2), (4) Date: Jul. 28, 2010

(87) PCT Pub. No.: WO2009/054183
PCT Pub. Date: Apr. 30, 2009

(65) Prior Publication Data
US 2010/0296203 A1    Nov. 25, 2010

(30) Foreign Application Priority Data
Oct. 26, 2007  (JP) ................................. 2007-278545

(51) Int. Cl.
*G11B 2005/3996* (2006.01)
*G11B 5/012* (2006.01)
(52) U.S. Cl. .................... 360/324; 365/158; 332/100
(58) Field of Classification Search .............. 360/55, 360/324; 331/16; 332/100, 149; 365/158
See application file for complete search history.

(56) References Cited

U.S. PATENT DOCUMENTS

| | | | |
|---|---|---|---|
| 6,529,556 B1 * | 3/2003 | Perdue et al. | 375/260 |
| 7,678,475 B2 * | 3/2010 | Slavin et al. | 428/811 |
| 2008/0150643 A1 | 6/2008 | Suzuki et al. | |

FOREIGN PATENT DOCUMENTS

| | | |
|---|---|---|
| EP | 1860769 A1 | 11/2007 |
| JP | 2006-295908 A | 10/2006 |
| WO | WO-2006/101040 A1 | 9/2006 |

OTHER PUBLICATIONS

S.I. Kiselev et al., "Microwave oscillations of a nanomagnet driven by a spin-polarized current", Nature, Sep. 25, 2003, vol. 425, p. 380-383.
Yoshishige Suzuki et al, "Spin Chunyu Jika Hanten Soshi no Koshuha Tokusei", Spin-ryu Kudo Device no Saizensen, The Magnetic Society of Japan, publication date Jan. 30, 2006, pp. 49 to 55, Fig. 6.
F.B. Mancoff et al., "Phase-locking in double-point-contact spin-transfer devices", Nature, Sep. 15, 2005, vol. 437, p. 393-395.
V. Cros et al., "Synchronization of spin-transfer oscillators driven by stimulated microwave currents", Physical Review B, vol. 73, The American Physical Society, Feb. 24, 2006, p. 060409-1-060409-4.

(Continued)

*Primary Examiner* — Arnold Kinkead
(74) *Attorney, Agent, or Firm* — Rabin & Berdo, P.C.

(57) ABSTRACT

A method for driving a spin valve element, including passing driving current through the spin valve element to generate an oscillation signal, and performing amplitude modulation of the driving current at a frequency lower than the oscillation frequency of oscillation signals. This amplitude modulation can be ON-OFF modulation, and the interval $t_{on}$ in the conducting state of the ON-OFF modulation is made to satisfy the relation $t_{on} < D^2/\alpha$, where $\alpha$ is the thermal diffusivity of the heat diffusion portion, and D is the thickness of the heat diffusion portion.

7 Claims, 5 Drawing Sheets

OTHER PUBLICATIONS

Shehzaad Kaka et al., "Mutual phase-locking of microwave spin torque nano-oscillators", Nature, Sep. 15, 2005, vol. 437, p. 389-392.

XiaoMin Yang et al.,"Nanoscopic templates using self-assembled cylindrical diblock copolymers for patterened media", J. Vac. Sci. Technol. B 22(6). Nov./Dec. 2004, p. 3331-3334.

W. H. Rippard et al, "Direct-current induced dynamics in $Co_{90}Fe_{10}/Ni_{80}Fe_{20}$ point contacts", Physical Review Letters, vol. 92, No. 2, Jan. 16, 2004, pp. 027201-1-027201-4.

M. R. Pufall et al., "Frequency modulation of spin-transfer oscillators", Applied Physics Letters, vol. 86, May 20, 2005, pp. 082506-1-082506-3.

Klaas B Klaassen et al., "Nanosecond and Sub-Nanosecond Writing Experiments", IEEE Transactions on Magnetics, vol. 35, No. 2, Mar. 1, 1999, pp. 625-631.

* cited by examiner

SPIN VALVE ELEMENT AND METHOD OF DRIVING SAME

TECHNICAL FIELD

This invention relates to a spin valve element, and to a method for driving such an element. More specifically, this invention relates to a spin valve element utilizing the tunneling magneto-resistance (TMR) effect or the giant magneto-resistance (GMR) effect, and to a method of driving such a spin valve element.

BACKGROUND ART

With recent advances in nanoelectronics, products are being developed which apply physical phenomena unique to magnetic materials with minute sizes. Of these, there have been particularly rapid advances in the field of spin electronics, which utilize the spin of free electrons in magnetic materials.

In the field of spin electronics, spin valve elements utilizing the tunneling magneto-resistance (TMR) effect occurring in a layered structure of a ferromagnetic layer, an insulating layer, and a ferromagnetic layer in order, or utilizing the giant magneto-resistance (GMR) effect occurring in a layered structure of a ferromagnetic layer, nonmagnetic layer (conducting layer), and a ferromagnetic layer in order, are currently regarded as having the greatest possibility of application.

Figure 7:
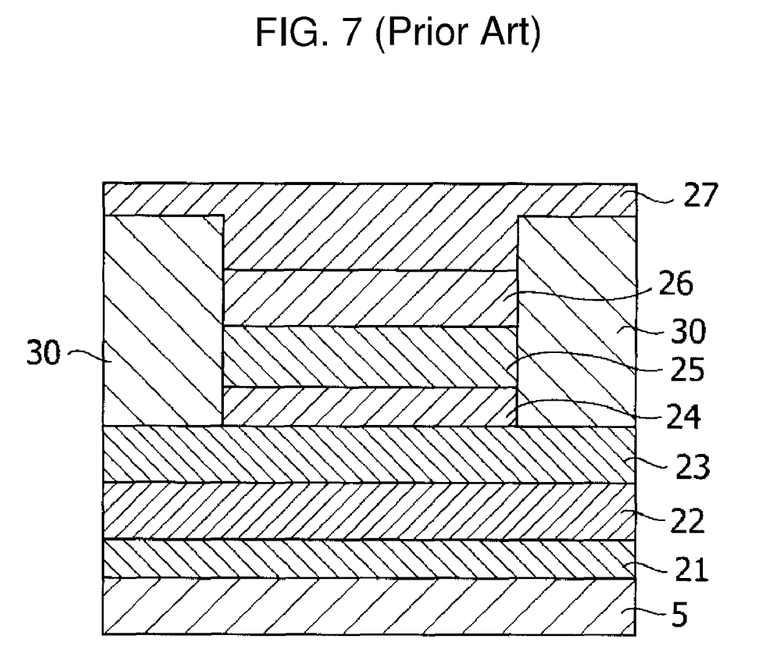
FIG. 7 is a cross-sectional view showing the basic constituent portions of a spin valve element utilizing TMR.
Figure 8:
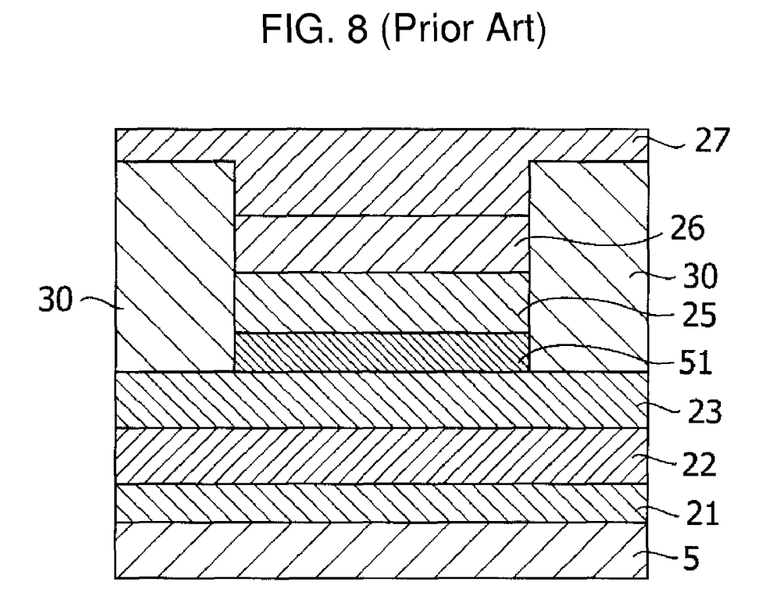
FIG. 8 is a cross-sectional view showing the basic constituent portions of a spin valve element utilizing GMR, and is a cross-sectional view showing the structure of the spin valve element of an embodiment of the invention.

FIG. 7 and FIG. 8 are cross-sectional views showing the configuration of spin valve elements of the prior art. Of these, FIG. 7 shows the basic constituent portions of a spin valve element utilizing TMR. This spin valve element has a configuration in which a single insulating layer 24 and ferromagnetic layers 23 (fixed layer) and 25 (free layer) sandwiching the insulating layer are formed on a substrate 5; to this are further added, as necessary, electrode layers 21, 27, an antiferromagnetic layer (pinning layer) 22, a capping layer 26, and similar. The direction of the magnetization of the fixed layer 23 is fixed by magnetic coupling with the antiferromagnetic layer 22 and similar. When electrons are passed from the fixed layer 23 toward the free layer 25 in this element, a torque acts to cause the magnetization of the free layer 25 to be aligned parallel to the direction of the magnetization of the fixed layer 23. And conversely, when electrons are passed from the free layer 25 toward the fixed layer 23, a torque acts on the magnetization of the free layer 25 so as to be antiparallel to the direction of the magnetization of the fixed layer 23. Through these actions, the direction of magnetization of the free layer 25 can be controlled by the direction of current in the free layer 25. This phenomenon is called spin transfer magnetization reversal. For reasons explained below, in conventional structures the size in in-plane directions must be made very small (approximately 150 nm or less), so that electron beam exposure or other expensive equipment is used. In order to suppress the exchange coupling due to the leakage magnetic field from the film edge portions of the ferromagnetic layers 23 (fixed layer) and 25 (free layer) sandwiching the insulating layer 24, the portion on the upper side of the insulating layer 24 is generally formed to be sufficiently smaller than on the substrate side, and an insulating film 30 is generally formed on the periphery. A number of methods may be used to form these structures; for example, after forming the layered film from the substrate up to the electrode 27, a negative resist is applied and photolithography is used for exposure, after which ion milling is performed to expose the upper portion of the insulating layer 24, after which an insulating layer 30 is formed by covering with $SiO_2$ or other means, followed by lift-off and a formation of the electrode 27 to be used for wiring.

FIG. 8 shows the basic constituent components of a spin valve element utilizing GMR. A difference with the element utilizing TMR in FIG. 7 is that the insulating layer 24 is replaced with a nonmagnetic layer 51; otherwise the functions are basically the same.

Among applications of these technologies, magnetic random access memory (MRAM) is attracting the greatest attention, and is anticipated as a replacement for conventional DRAM (dynamic random access memory) and SDRAM (synchronous DRAM).

Further, it is known that if a current and an external magnetic field are simultaneously applied to these spin valve elements, microwave oscillation occurs (see, for example, S. I. Kiselev, et al, "Microwave oscillations of a nanomagnet driven by a spin-polarized current", Nature, Vol. 425, p. 380 (2003)). As an example, with respect to current direction, suppose that a current is passed such that the torque acts on the magnetization of the free layer 25 so as to become antiparallel to the direction of the magnetization of the fixed layer 23, and with respect to an external magnetic field, suppose that a torque acts on the magnetization of the free layer 25 so as to become parallel to the direction of the magnetization of the fixed layer 23. In this case, under conditions in which the two torques are counterbalanced, high-frequency oscillation in the microwave region can be induced.

In addition, it has been reported that when two elements are formed adjacently and when currents and external magnetic fields appropriate to these are applied, the oscillation frequencies and phases of the two become coincident, the frequency width is decreased, and microwave output at this time is also increased (see, for example, S. Kaka, et al, "Mutual phase-locking of microwave spin torque nano-oscillators", Nature, Vol. 437, p. 389 (2005); F. B. Mancoff, et al, "Phase-locking in double-point-contact spin-transfer devices", Nature, Vol. 437, p. 393 (2005); J. Grollier, et al, "Synchronization of spin-transfer oscillator driven by stimulated microwave currents", Physical Review B73, p. 060409 (2006)). This phenomenon is called a phase locking phenomenon, and the mechanism, though not yet clarified, is inferred to arise from interaction between the high-frequency magnetic fields generated by each of the elements; this phenomenon is attracting attention as means of increased output.

The oscillation output of the above microwave oscillator elements is, in numerous reports, approximately 0.16 μW for TMR, and remains at approximately 10 pW for GMR, which are very low levels for practical application. Hence in order to obtain higher output, numerous minute elements must be integrated.

(2006)

However, when using a spin valve element for microwave oscillation as described above, due to the Joule heat generated by the current, the element may be overheated. That is, because a single spin valve element is small, measuring approximately 100 nm on a side, the current density is high, and so Joule heat tends to cause local overheating. Because of this heat, material oxidation and other degradation tend to occur, and there has also been the problem that element failure readily occurs. Particularly in the case of elements using TMR, because current flows in an insulating layer of MgO or similar by the tunnel effect, the Joule heat at this time is extremely great compared with other layers. Moreover, when numerous elements are connected in series or in parallel and integrated as described above, the heat generation density increases, and these problems become still more serious.

Further, an actual example is here used to describe a problem. The impedance of an entire spin valve must be matched to a prescribed impedance in order to suppress high-frequency transmission losses. In the microwave region, input/output impedances are generally set at 50Ω. For example, by parallel-connecting 20 TMR spin valve elements each element of which is approximately 1 kΩ, an overall element impedance of 50Ω can be obtained. Such parallel connection is for example achieved by using an alumite minute hole structure and forming electrodes. Twenty elements are formed in mutual proximity, and so may be regarded as thermally coupled. Upon applying a voltage of for example 0.5 V to each element, the driving current per element is approximately 0.5 mA, and the input power is 0.25 mW per element. Because 20 elements are present, for the element as a whole the driving current is 10 mA, and as much as 5 mW of power is input. As one example, if 5 mW of power is input continuously for 10 nsec, and Cu measuring 100 nm diameter×100 nm thick (heat capacity $3.4 \times 10^6$ (J/m$^3$K)) is heated in an adiabatic state by the resulting Joule heat, then the temperature increase reaches 1873 K. Such a large temperature increase causes failure of the spin valve element. Even when the temperature increase is not this great, oxidation and other degradation of the material may occur, and changes in magnetic characteristics dependent on temperature may give rise to instability in the spin valve element characteristics during operation. Hence there is a need to suppress increases in the element temperature insofar as possible. In particular, temperature increases are already a major problem in TMR elements with high electrical resistance, and as development advances and TMR elements with a high MR ratio (change in resistance upon magnetization reversal) are obtained, the average electrical resistance will also be higher, so that even more serious problems will result.

In this way, a method is sought in order that, during current driving of a spin valve element, by suppressing the temperature increase occurring due to the input power, degradation of spin valve element materials arising from the temperature increase and instability of the magnetic characteristics can be prevented, and the spin valve element can be driven with stability.

DISCLOSURE OF THE INVENTION

In light of these circumstances, an object of this invention is to provide a method for suppressing local overheating of a spin valve element due to Joule heat, and for stabilizing operation of the spin valve element.

In any mode of the invention, a driving method is provided to drive a spin valve element, comprising an intermediate layer which is an insulating member or a nonmagnetic member and a pair of ferromagnetic layers sandwiching the intermediate layer, with a driving current being passed through the spin valve element thereby obtaining an oscillation signal, the method comprising a step of performing amplitude modulation of the driving current by a frequency lower than the oscillation frequency of the oscillation signal.

Further, in any mode of the invention, a spin valve element is provided, comprising an intermediate layer which is an insulating member or a nonmagnetic member, a pair of ferromagnetic layers sandwiching the intermediate layer, and a heat diffusion portion, with the heat diffusion portion being provided in contact with a face which is a face of either of the ferromagnetic layers and which is not in contact with the intermediate layer, and the thickness D of the heat diffusion portion satisfying the relation 0.5 nsec<$D^2/\alpha$, where $\alpha$ is the thermal diffusivity of the heat diffusion portion.

By means of any of the modes of this invention, overheating during driving of a spin valve element can be prevented. By means of this invention, at least one among failure, material degradation, and destabilization of magnetic characteristics, caused as a result of overheating, can be prevented, and oscillation signals can be obtained.

BEST MODE FOR CARRYING OUT THE INVENTION

Below, embodiments of the invention are explained referring to the drawings.

A major technical point of this invention is the discovery that, by adopting an operation mode in which heat generation and cooling are repeated by modulating the driving current, the heat diffusion distance of the element is made equal to or greater than a constant value, which is effective for suppressing temperature increases.

Figure 1:
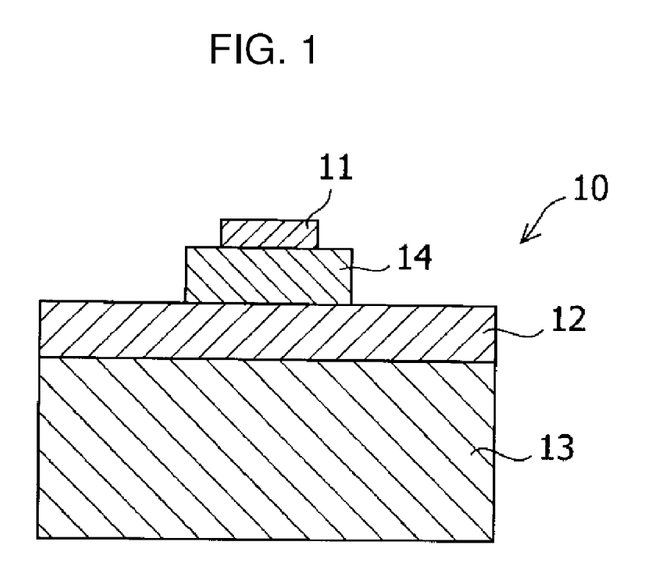
FIG. 1 is a cross-sectional view showing the structure of the spin valve element in an embodiment of the invention.

FIG. 1 shows the configuration of a spin valve element 10 which is one embodiment of the invention. The spin valve element 10 comprises the insulating member 11 which is a heat-generating member, a heat diffusion portion 14, an insulating layer 12, and a substrate 13. The heat diffusion portion 14 is a portion having the function of temporarily holding heat generated by the spin valve element through its own heat capacity, and simultaneously can be used as an electrode to supply current to the spin valve element 10. In FIG. 1, electrodes to supply current to the spin valve element are not shown. The insulating layer 12 is a portion which, when considering a system in which heat is generated and enters and exits, effectively functions as a thermal barrier having relatively low thermal conductivity, and can for example be formed by an electrically insulating layer, or in a separate embodiment, can be formed by providing a gap with the substrate 13 by means of a supporting member, configured with the air layer of the gap provided at a similar position. When the insulating layer 12 is an electrically insulating layer, the insulating layer 12 can be formed from inorganic material, plastic, or similar. Even in such cases, compared with the spin valve layers, primarily comprising metal thin films, this portion has a low thermal conductivity.

In general the substrate 13 is assumed to be a member which can be regarded as effectively at a constant temperature; for example, a substrate which functions as a heat sink can be used. As another example, a cooling water receptacle used for heat dissipation can also be used; in any of these cases, the following discussion applies. In particular, in the following examination, an inorganic material having electrically insulating functions is assumed as the insulating layer 12, and a silicon substrate is assumed as the substrate 13. These are presented as examples in explaining the advantageous results of the invention, but in no way limit the content of the invention.

Below, the explanation of temperature changes of an element is divided into two stages, which are (A) the temperature increase in the spin valve element 11 and the heat diffusion portion 14 during the on-time, and (B) heat conduction via the electrically insulating layer 12 during repetition of the on-off cycle.

First, the temperature increase in the spin valve element 11 and the heat diffusion portion 14 during the on-time of (A) is explained. From the configuration of FIG. 1, only heat conduction in the film thickness direction is considered. Here, the coordinate in the film thickness direction is taken to be x. Heat diffusion in directions parallel to the film plane are in essence not considered, so that the same results can be applied to cases in which elements are arranged in these directions. In this case, the change with time in the temperature distribution is expressed by the following equation.

$$C\rho dT(t,x)/dt = kd^2T(t,x)/dx^2 + Q \tag{3}$$

Here C is the specific heat (J/Km$^3$) of the spin valve element 11 and the heat diffusion portion 14, $\rho$ is the density (kg/m$^3$) of the spin valve element 11 and the heat diffusion portion 14, T(t,x) is the temperature (K) as a function of time t and position x, k is the thermal conductivity (W/mK) of the spin valve element and the heat diffusion portion 14, and Q is the amount of heat generated (W). Here, C, $\rho$ and k are all normally defined as functions of position x; here, however, they are used as values for the spin valve element 11 and heat diffusion portion 14. In effect, the volume of the spin valve element 11 is small compared with that of the heat diffusion portion 14, so that in the following analysis, the spin valve element 11 is assumed in the analysis as a part of the heat diffusion portion 14, having the constant values of C, $\rho$ and k being same as those for the heat diffusion portion 14.

Solutions to the above equation will differ with the initial conditions and boundary conditions; from a dimensional analysis of equation (3), the heat diffusion distance $D_{on}$ in the heat diffusion layer 14 of heat generated by the spin valve element 11 is expressed as a function of the on-time $t_{on}$ as follows.

$$D_{on} = ((k/C\rho)t_{on})^{0.5} = (\alpha t_{on})^{0.5} \tag{4}$$

Figure 2:
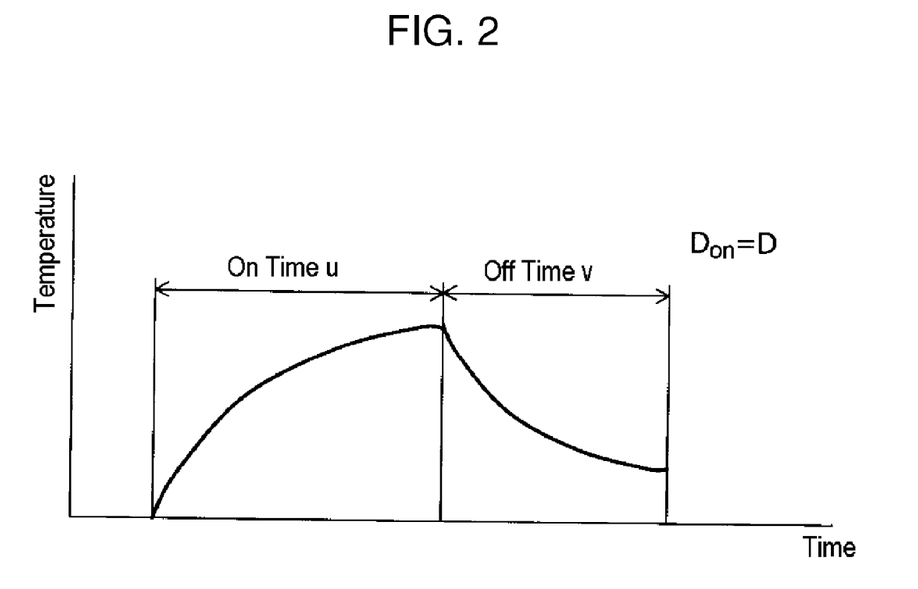
FIG. 2 is an explanatory diagram showing temperature changes when, in the spin valve element in an embodiment of the invention, $D_{on}$=D.

Here $\alpha$ (=k/C$\rho$) is the thermal diffusivity of the heat diffusion layer 14. When the $D_{on}$ of the above equation is equal to the thickness D of the heat diffusion layer 14, thermal diffusion proceeds up to $D_{on}$, and within this range the average temperature Tm rises in proportion to the 0.5 power (square root) of the time, as indicated by the following equation. This behavior is shown in FIG. 2.

$$Tm = Qt_{on}/(C\rho SD_{on}) = Qt_{on}^{0.5}/(S(kC\rho)^{0.5}) \tag{5}$$

Here S is the cross-sectional area (m$^2$) of the heat diffusion layer 14. If the cross-sectional area of the heat diffusion layer 14 is greater than the cross-sectional area of the spin valve element, then the heat conduction area is effectively greater than the heat generation area, and so acts favorably for temperature suppression.

Figure 3:
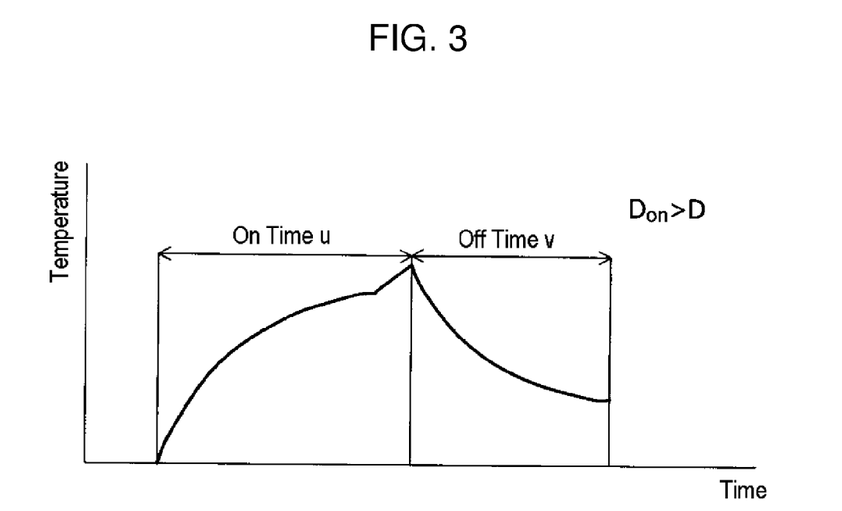
FIG. 3 is an explanatory diagram showing temperature changes when, in the spin valve element in an embodiment of the invention, $D_{on}$>D.

On the other hand, when $t_{on}$ is large and $D_{on}$ is larger than D, heat diffusion is blocked by the insulating layer 12 with low thermal conductivity, and so the average temperature rises rapidly in proportion to the on-time $t_{on}$, as in the equation below. This behavior is shown in FIG. 3.

$$Tm = Qt_{on}/(C\rho SD) \tag{6}$$

Figure 4:
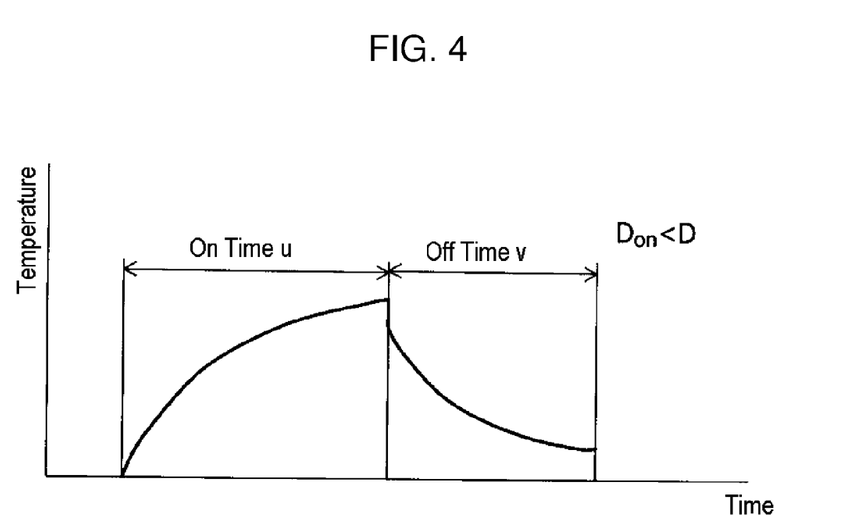
FIG. 4 is an explanatory diagram showing temperature changes when, in the spin valve element in an embodiment of the invention, $D_{on}$<D.

Further, in cases in which $D_{on}$ is smaller than D, because heat diffusion continues during the off-time, the effective Tm during the cooling process in the off-time indicated below is reduced by ($D_{on}$/D). This behavior is shown in FIG. 4.

In this way, for suppressing the average temperature of the spin valve element 11 and heat diffusion layer 14 defined in equations (5) and (6), it is effective to select the on-time, or decide on an element structure, such that $D_{on}$<D. That is, from $(\alpha t_{on})^{0.5}$<D, it is desirable that $t_{on}$<$D^2/\alpha$.

Next, the heat conduction stage via the insulating layer 12 in repetition of the on-off cycle in (B) is explained. In the case of the configuration of FIG. 1, the average temperature T(t) of the spin valve element 11 and heat diffusion layer 14 is expressed as follows.

$$CVdT(t)/dt = -k(S/L)T(t) + Q \tag{7}$$

Here V is the total volume (m3) of the spin valve element 11 and the heat diffusion layer 14, and L is the thickness (m) of the insulating layer 12. A solution to equation (7) is given below.

$$T(t) = (QL/kS)\{1-\exp(-ktS/CVL)\} = T_0\{1-\exp(-\beta t)\} \tag{8}$$

Here $T_0$=QL/kS, and $\beta$=kS/CVL. Also, when there is no heat generation in particular, $$CVdT(t)/dt = -k(S/L)T(t) \tag{9}$$

$$T(t) = -T_1\exp(-\beta t) \tag{10}$$

Figure 5:
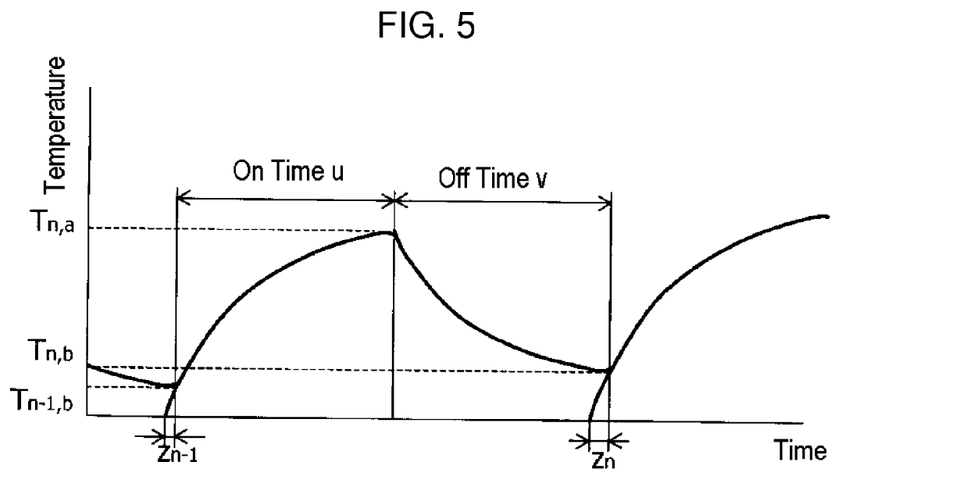
FIG. 5 is an explanatory diagram showing a driving method for the spin valve element of an embodiment of the invention.
Figure 9:
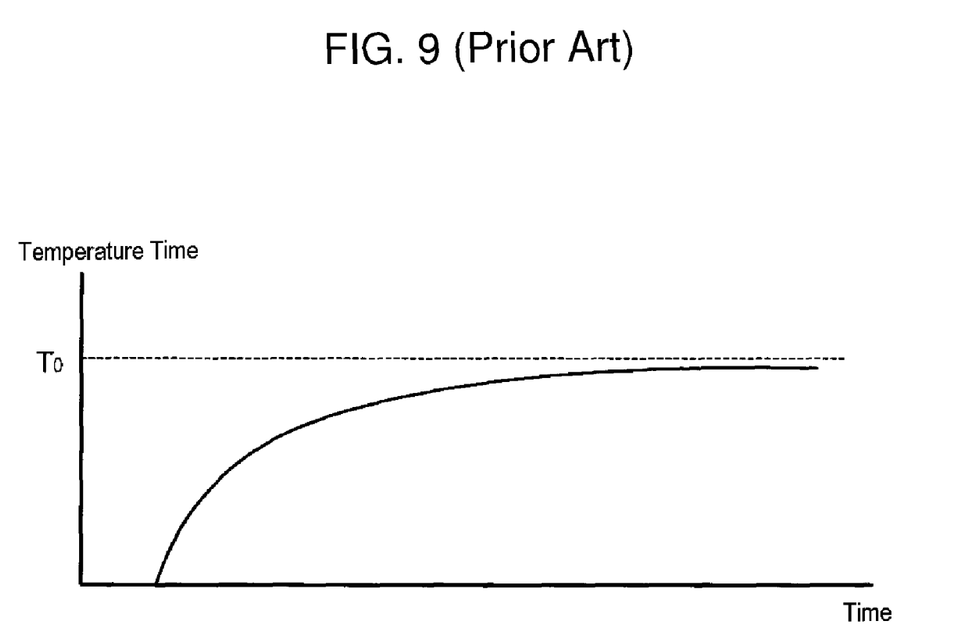
FIG. 9 is an explanatory diagram showing a spin valve element driving method of the prior art.

First, for comparison, a case in which the current is not on-off modulated is considered; the average temperature of the spin valve element 11 and the heat diffusion layer 14 conforms to equation (2), and as shown in FIG. 9 increases with time, asymptotically approaching $T_0$ (=QL/kS). On the other hand, when the current is modulated with an on-time u (=$t_{on}$) and off-time v, the temperature changes as shown in FIG. 5. That is, if the temperature at the end of the (n−1)th cycle is $T_{n-1,b}$, the temperature at the end of the on-time u of the (n−1)th cycle is $T_{n,a}$, the off-time following this is v, and the temperature at the end is $T_{n,b}$, then $$T_{n-1,b} = T_0\{1-\exp(-\beta z_{n-1})\} \tag{11}$$

$$T_{n,a} = T_0\{1-\exp(-\beta(u+z_{n-1}))\} \tag{12}$$

$$T_{n,b} = T_{n,a}\exp(-\beta v) \tag{13}$$

Here, as defined in equation (11), $z_{n-1}$ is a time parameter used to convert the temperature $T_{n-1,b}$ at the end of the n−1th cycle, taking the situation into consideration that the temperature increase in the on-time of the next nth cycle has begun early. From equations (11) through (13), $$T_{n,b} = T_0\{1-\exp(-\beta(u+z_{n-1}))\}\exp(-\beta v) = T_0\{1-\exp(-\beta z_n)\} \tag{14}$$

and so from this, $$\exp(-\beta z_n) = 1-\exp(-\beta v) + \exp\{-\beta(u+v)\}\exp(-\beta z_{n-1}) \tag{15}$$

is obtained.

In general, when $X_n = AX_{n-1} + B$, $X_n = A_n + B(1-A_n)/(1-A)$, and moreover, when A<1, as n→∞, $X_n$→B/(1−A), so that at this time $$\exp(-\beta z_n) \to \{1-\exp(-\beta v)\}/\{1-\exp(-\beta(u+v))\}$$

is obtained. That is, the temperature $T_a$ at the end of the on-time after a sufficiently great number of cycles is expressed as follows.

$$\begin{aligned} T_a &= T_0\{1 - \exp(-\beta(u+z))\} \\ &= T_0\{1 - \exp(-\beta u)\exp(-\beta z)\} \\ &= T_0 \left[ \begin{array}{c} 1 - \exp(-\beta u)\{1 - \exp(-\beta v)\}/ \\ \{1 - \exp(-\beta(u+v))\} \end{array} \right] \\ &= T_0\{1 - \exp(-\beta u)\}/ \\ &\quad \{1 - \exp(-\beta(u+v))\} \end{aligned} \tag{16}$$

In particular, when u=v, the following equation is obtained.

$$T_a = T_0/\{1+\exp(-\beta v)\} \tag{17}$$

From equation (16) or from equation (17), by repeating the on-off cycle, the final temperature can be lowered compared with a case in which an off cycle is not added.

In general, the microwave oscillation frequency of a spin valve element is in the range from 1 to 100 GHz, and in order to effectively receive the electromagnetic signals, it is desirable that the on-time in the on-off cycle to suppress overheating be larger than from 0.01 to 1 ns; hence the on-off cycle frequency must be lower than 100 GHz, and preferably should be lower than 1 GHz.

Conversely, if the thermal diffusivity α of the heat diffusion portion provided in the spin valve element and the thickness D of the heat diffusion portion satisfy the following relation, which is equivalent to an on-off cycle time ratio of 1:1 and 1 GHz, then the above frequencies can be accommodated.

$$0.5 \text{ nsec} < D^2/\alpha \tag{18}$$

That is, in order to relax the margin of the on-time limiting condition ($t_{on} < D^2/\alpha$), it is effective to increase the thickness D of a non-heat generating portion. For example, when Cu (thermal diffusivity $1.15 \times 10^4$ m$^2$/sec) is chosen as the material of the heat diffusion portion 14, corresponding to the non-heat generating portion just mentioned above, in order to make $t_{on}$ equal to 1 nsec, or to 10 nsec, it is desirable that D be made 339 nm or greater, or 1.07 μm or greater.

As the materials forming a spin valve element employing a driving method of this invention, silicon substrate or glass substrate can be used as the substrate 5, and copper substrate which is highly functional as a heat sink can also be used; where necessary, water cooling or another method can be used for cooling. As the electrode layers 21, 29, 31, Ta, Pt, Cu, Au, Ag, Al, and Mo; as the antiferromagnetic layer 22, IrMn and PtMn; as the ferromagnetic layer 23 (fixed layer), Co, CoFe, CoFeB; as the insulating layer 24, MgO and an Al oxide; as the nonmagnetic layer 51, Cu; as the ferromagnetic layer 25 (free layer), Co, CoFe, CoFeB, and NiFe; and as the capping layer 27, Cu and Pd, are representative examples, but materials are not limited to these. Frequently, the material properties of the ferromagnetic layer 23 (fixed layer) and the ferromagnetic layer 25 (free layer) are made the same, and the film thickness of the former is made greater than the film thickness of the latter, so that a difference in coercive forces is provided, and spin valve functions are achieved. After layering these layers, it is effective to perform magnetic field annealing in order to adjust the crystallinity of the layers and the magnetic anisotropy of the fixed layer. As necessary, the ferromagnetic layer 23 (fixed layer) and ferromagnetic layer 25 (free layer) can for example be made CoFeB/Ru/CoFeB or other antiferromagnetic coupled films. Here, materials indicated using a slash (/) are multilayer films in which layers of the materials are layered in that order.

As the material of the heat diffusion portion 14, it is preferable that a material with high thermal diffusivity be employed, and Cu, Au, Ag, Al, Mo, or other metal materials are appropriate.

In order to more effectively suppress temperature increases through on-off modulation, it is effective to raise the thermal diffusivity of the insulating layer 12 to the extent possible. To this end, alumina and aluminum nitride, having high breakdown voltages and heat resistance and with comparatively high thermal diffusivities, are appropriate as the material of the insulating layer 12.

Further, a driving method of this invention can be similarly applied to an integrated element in which the above spin valve elements are connected in series or in parallel. As the means of integration, a porous insulating layer obtained, for example, from anodic oxidation of an aluminum film, or resin self-organization, or nanoimprinting technology, is used; in the minute holes thereof are formed the electrodes of spin valve elements, or the insulating layers of spin valve elements, or the nonmagnetic layers and a portion of the ferromagnetic layers, or all of these. By utilizing these porous insulating layers, minute holes with uniform shapes can be formed by an inexpensive process. In particular, if nanoimprinting is used, minute holes can be formed having a high aspect ratio (the ratio of hole depth to hole diameter), which is appropriate for forming layered structures with numerous layers. That is, in general spin valve elements, the magnetic film shape is often made elliptical with the aim of controlling the direction of the in-plane anisotropy of the magnetic film; such shapes can also be formed easily. On the other hand, in anodic oxidation treatment of aluminum film the minute hole shape is circular, and it is difficult to control the direction of the magnetic film in-plane anisotropy, so that in essence it is advantageous to employ a perpendicular magnetization design, with alignment of the crystal anisotropy in a direction perpendicular to the film plane. As the means of crystal anisotropy alignment, generally a Ru underlayer, or a vertical columnar structure, are employed. In resin self-organization also, the minute hole shape is circular, and it is advantageous to employ a perpendicular magnetization design in which the crystal anisotropy is aligned in a direction perpendicular to the film plane. In resin self-organization, minute holes are obtained with an aspect ratio higher than that for nanoimprinting techniques, making this method appropriate for obtaining layered structures of many layers.

Figure 6:
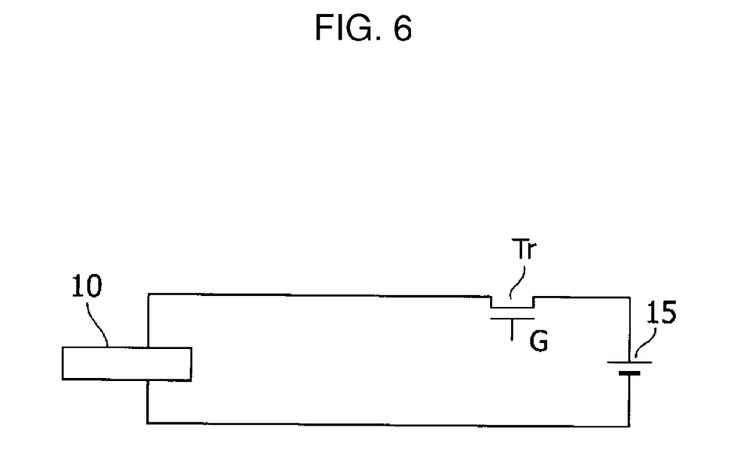
FIG. 6 is an explanatory diagram showing an example of a spin valve element driving circuit in an embodiment of the invention.

An electric circuit to realize a driving method of this invention can easily be fabricated by using a transistor Tr to control the driving current to drive the spin valve element 10, for example as shown in FIG. 6.

In this way, driving means can be provided in which local overheating of the spin valve element due to Joule heat is suppressed, and the spin valve element is driven with stability.

PRACTICAL EXAMPLE 1

First, a TMR type spin valve element was manufactured by the following procedure. That is, on a silicon substrate 5 with an oxide film of thickness 10 nm, a Cu (340 nm) thin film was formed as a diffusion layer/electrode layer 21. Then, $Co_{70}Fe_{30}$ (20 nm) as the ferromagnetic layer 23, MgO (0.6 nm) as the insulating layer 24, $Co_{40}Fe_{40}B_{20}$ (2 nm) as the ferromagnetic layer 25, and Cu (2 nm) as the capping layer 26, were layered in order. Further, a negative resist was applied, and electron beam irradiation was used to perform patterning, after which ion milling was used to form fifty spin valve elements with an elliptical (100 nm×50 nm) column shape. The spacing between elements, taken to be the distance between centers, was 250 nm. A CVD method was used to form an $SiO_2$ film, after which the resist on the spin valve elements was removed by lift-off, and after forming an upper electrode, annealing was performed at 350° C. in a magnetic field of approximately 4 kOe. The electrical resistance of the elements was approximately 2.5 kΩ per element, and by connecting these 50 elements in parallel, a total impedance of approximately 51Ω could be obtained. In the parentheses following the different materials, the film thickness of the layer is indicated.

Next, a 1 T DC magnetic field was applied to this element in the direction parallel to the magnetic field of the fixed layer, and tests were conducted in which a voltage was applied under the conditions indicated below, so that electrons flowed from the free layer to the fixed layer. That is, on-off voltages of DC 1 V/0 V were applied such that the respective time widths were 1 nsec and 1 nsec, and the temperature reached and the microwave oscillation characteristics were measured. For comparison, measurements were also performed during continuous application of the on voltage.

PRACTICAL EXAMPLE 2

After cleaning the surface of a silicon substrate 5 with hydrofluoric acid and removing the oxide film, sputtering was performed to form an alumina thin film 50 nm as the insulating layer 12; otherwise, the spin valve element of Practical Example 2 was formed similarly to that of Practical Example 1 for use as the sample of Practical Example 2, and conduction tests were conducted under conditions similar to those of Practical Example 1.

PRACTICAL EXAMPLE 3

As the diffusion layer/electrode layer 21 a Cu thin film of thickness 340 nm was used, as the insulating layer 12 an alumina thin film of thickness 30 nm was used, and as the insulating layer 24 an MgO film of thickness 1.5 nm was used; 2000 elements were formed, with the spacing between elements, taken to be the distance between centers, at 450 nm, and the 2000 elements were connected in parallel; otherwise, manufacturing was similar to that of Practical Example 1, to obtain the sample of Practical Example 3. The electrical resistance of the elements was approximately 102 kΩ per element, and by connecting the 2000 elements in parallel, the total impedance could be made approximately 51Ω. A 1 T DC magnetic field was applied to this element in the direction parallel to the magnetic field of the fixed layer, and tests were conducted in which a voltage was applied under the conditions indicated below, so that electrons flowed from the free layer to the fixed layer. That is, on-off voltages of DC 40 V/0 V were applied such that the respective time widths were 1 nsec and 2 nsec, and the temperature reached and the microwave oscillation characteristics were measured. For comparison, measurements were also performed during continuous application of the on voltage.

PRACTICAL EXAMPLE 4

On a silicon substrate 5 with an oxide film of thickness 10 nm was formed a Cu (340 nm) thin film as the diffusion layer/electrode layer 21. Then, Ru (5 nm)/$Co_{70}Fe_{30}$ (20 nm) as the ferromagnetic layer 23, a Cu layer (1.5 nm) as the nonmagnetic layer 51, NiFe (4.5 nm) as the ferromagnetic layer 25, Cu (2 nm) as the capping layer 26, and Pt (10 nm) as the intermediate electrode layer 29, were layered in order, to obtain one spin valve layer. By further repeating this process, a total of eleven spin valve layers were layered. Then, a procedure similar to that of Practical Example 1 was used to form five spin valve elements with an elliptical (100 nm×50 nm) columnar shape. The spacing between elements, taken to be the distance between centers, was 450 nm. After layering Cu (30 nm) as the electrode layer 27, annealing was performed at 250° C. in a magnetic field of approximately 4 kOe, to obtain a sample of Practical Example 4. The electrical resistance of a spin valve layer 20 with this configuration was 23Ω per layer, and the resistance was approximately 250Ω for eleven layers connected in series; by connecting these five in parallel, the overall electrical resistance was approximately 50Ω. A 1 T DC magnetic field was applied to this element in the direction parallel to the magnetic field of the fixed layer, and tests were conducted in which a voltage was applied under the conditions indicated below, so that electrons flowed from the free layer to the fixed layer. That is, on-off voltages of DC 2.5 V/0 V were applied such that the respective time widths were 1 nsec and 1 nsec, and the temperature reached and the microwave oscillation characteristics were measured. For comparison, measurements were also performed during continuous application of the on voltage.

COMPARISON EXAMPLE 1

Other than the fact that the thickness of the Cu thin film used as the diffusion layer/electrode layer 21 was 30 nm, the sample of Comparison Example 1 was formed similarly to that of Practical Example 1, and measurements similar to those of Practical Example 1 were conducted.

COMPARISON EXAMPLE 2

Other than the fact that the thickness of the Cu thin film used as the diffusion layer/electrode layer 21 was 30 nm, the sample of Comparison Example 2 was formed similarly to that of Practical Example 3, and measurements similar to those of Practical Example 3 were conducted.

Calculated results and measured results for Practical Examples 1 through 4 and for Comparison Examples 1 and 2 appear in Table 1.

TABLE 1

| | Units | Practical Example 1 | Practical Example 2 | Practical Example 3 | Practical Example 4 | Comparison Example 1 | Comparison Example 2 |
|---|---|---|---|---|---|---|---|
| Calculated on-off modulation equilibrium temperature | K | 126 | 49 | 318 | 12 | 189 | 599 |

TABLE 1-continued

|  | Units | Practical Example 1 | Practical Example 2 | Practical Example 3 | Practical Example 4 | Comparison Example 1 | Comparison Example 2 |
|---|---|---|---|---|---|---|---|
| Measured on-off modulation equilibrium temperature | K | 120 | 41 | 309 | 10 | 172 | 597 |
| Microwave output during on-off modulation | W | 2.0E−05 | 2.4E−06 | 3.8E−04 | 8.3E−09 | 8.0E−07 | <1.0e−10 |
| Calculated continuous-on equilibrium temperature | K | 238 | 83 | 600 | 24 | 238 | 600 |
| Measured continuous-on equilibrium temperature | K | 229 | 67 | 587 | 23 | 225 | 602 |
| Microwave output during continuous-on | W | 9.0E−06 | 1.7E−05 | <1.0e−10 | 7.2E−09 | 6.7E−07 | <1.0e−10 |

In each of the practical examples and comparison examples, good agreement was observed between measured and calculated temperatures. As is clear from each of the practical examples, through the on-off control of this invention, temperature increases in the samples were suppressed, and stabilized microwave output (compared with on periods) was obtained. In contrast, during DC driving (continuous-on), and particularly in the sample of Practical Example 3 with a large load, the temperature of the element portion approached 600° C., and only a low value was obtained for microwave output. Further, upon comparing Practical Example 3 with Comparison Example 1, by adding a sufficiently large heat diffusion portion, temperature increases could be effectively suppressed particularly when on-off modulation was used, so that the advantageous results of the invention were confirmed.

Thus through this invention it is possible to provide means for stable driving of a spin valve element, with local overheating of the spin valve element due to Joule heat suppressed. Embodiments of the invention have been described, but the invention is not limited to the embodiments described, and various modifications, alterations, and combinations are possible based on the technical concepts of the invention.

FIG. 2
TEMPERATURE
TIME
on TIME u
off TIME v
FIG. 3
TEMPERATURE
TIME
on TIME u
off TIME v
FIG. 4
TEMPERATURE
TIME
on TIME u
off TIME v
FIG. 5
TEMPERATURE
TIME
on TIME u
off TIME v
FIG. 9
TEMPERATURE
TIME

The invention claimed is:

1. A method of driving a spin valve element having an intermediate layer, which is an insulating layer or an electrically conductive nonmagnetic layer, a pair of ferromagnetic layers sandwiching the intermediate layer, and a heat diffusion portion in contact with one of the pair of the ferromagnetic layers and not in contact with the intermediate layer, comprising:

passing a driving current through the spin valve element to generate an oscillation signal; and performing binary ON-OFF modulation on the driving current using a frequency lower than an oscillation frequency of the oscillation signal, the binary ON-OFF modulation including a conducting state, and a shutoff state in which the driving current passing through the spin valve element is zero.

2. A method of driving a spin valve element having an intermediate layer, which is an insulating layer or an electrically conductive nonmagnetic layer, a pair of ferromagnetic layers sandwiching the intermediate layer, and a heat diffusion portion in contact with one of the pair of the ferromagnetic layers and out of contact with the intermediate layer, comprising:

passing a driving current through the spin valve element to generate an oscillation signal; and performing binary ON-OFF modulation on the driving current using a frequency lower than an oscillation frequency of the oscillation signal, the binary ON-OFF modulation including a conducting state, and a shutoff state in which the driving current passing through the spin valve element is zero, wherein the conducting state of the ON-OFF modulation has an interval $t_{on}$ smaller than $D^2/\alpha$, $\alpha$ being a thermal diffusivity of the heat diffusion portion and D being a thickness of the heat diffusion portion.

3. The method of driving a spin valve element according to claim 1, wherein the oscillation frequency is in a range from 1 GHz to 100 GHz, and the frequency of amplitude modulation is less than 1 GHz.

4. The method of driving a spin valve element according to claim 2, wherein the oscillation frequency is in a range from 1 GHz to 100 GHz, and the ON-OFF modulation frequency is less than 1 GHz.

5. A spin valve element, comprising:
an intermediate layer, which is an insulating layer or an electrically conductive nonmagnetic layer;
a pair of ferromagnetic layers sandwiching the intermediate layer; and
a heat diffusion portion in contact with one of the pair of the ferromagnetic layers and not in contact with the intermediate layer, and having a thickness D that satisfies the relation $0.5 \text{ nsec} < D^2/\alpha$, $\alpha$ being a thermal diffusivity of the heat diffusion portion.

6. The spin valve element according to claim 5, wherein the heat diffusion portion is used as an electrode which supplies driving current to the spin valve element.

7. The method of driving a spin valve element of claim 1, wherein the oscillation frequency is in a range from 1 GHz to 100 GHz, and the ON-OFF modulation frequency is less than 1 GHz.

* * * * *